United States Patent
Kellerman et al.

(10) Patent No.: US 7,033,443 B2
(45) Date of Patent: Apr. 25, 2006

(54) GAS-COOLED CLAMP FOR RTP

(75) Inventors: Peter L. Kellerman, Essex, MA (US); Victor M. Benveniste, Gloucester, MA (US); Frederick M. Carlson, Potsdam, NY (US)

(73) Assignee: Axcelis Technologies, Inc., Beverly, MA (US)

( * ) Notice: Subject to any disclaimer, the term of this patent is extended or adjusted under 35 U.S.C. 154(b) by 304 days.

(21) Appl. No.: 10/402,809

(22) Filed: Mar. 28, 2003

(65) Prior Publication Data

US 2004/0187788 A1    Sep. 30, 2004

(51) Int. Cl.
*H01L 21/00* (2006.01)
*C23C 16/00* (2006.01)

(52) U.S. Cl. .................. 118/724; 118/728; 118/725; 156/345.51; 156/345.52; 156/345.53; 361/234; 279/128; 204/192.1; 204/298.01

(58) Field of Classification Search ............ 156/345.53, 156/345.51, 345.52; 118/724, 728, 725; 361/234; 279/128; 204/192.1, 298.1
See application file for complete search history.

(56) References Cited

U.S. PATENT DOCUMENTS

| | | | |
|---|---|---|---|
| 5,583,736 A | 12/1996 | Anderson et al. | |
| 5,805,408 A | 9/1998 | Maraschin et al. | |
| 5,810,933 A * | 9/1998 | Mountsier et al. | ........... 118/724 |
| 5,838,529 A | 11/1998 | Shufflebotham et al. | |
| 6,073,576 A | 6/2000 | Moslehi et al. | |
| 6,378,600 B1 | 4/2002 | Moslehi | |
| 2001/0011425 A1 | 8/2001 | Granneman et al. | |
| 2002/0139307 A1 | 10/2002 | Ryding et al. | |
| 2003/0030960 A1 * | 2/2003 | Kanno et al. | ............... 361/234 |

* cited by examiner

*Primary Examiner*—Ram N Kackar
(74) *Attorney, Agent, or Firm*—Eschweiler & Associates, LLC

(57) ABSTRACT

The present invention is directed to a semiconductor thermal processing apparatus and a method for thermally cooling a semiconductor substrate. According to one aspect of the present invention, a gas-cooled clamp and associated method is disclosed which provides cooling of a substrate by thermal conduction generally in the free molecular regime. The gas-cooled clamp comprises a clamping plate having a plurality of protrusions that define gaps therebetween, wherein a distance or depth of the gaps are associated with a mean free path of the cooling gas therein. The gas-cooled clamp further comprises a pressure control system operable to control a backside pressure of the cooling gas within the plurality of gaps to thus control a heat transfer coefficient of the cooling gas, wherein the heat transfer coefficient of the cooling gas is primarily a function of the pressure and substantially independent of the gap distance.

22 Claims, 14 Drawing Sheets

VALVE

| | 205A | 205B | 205C |
|---|---|---|---|
| ROUGH | OPEN | CLOSED | CLOSED |
| LO-VAC (COOLED) | CLOSED | OPEN | CLOSED |
| HI-VAC (ADIABATIC) | OPEN | OPEN | CLOSED |
| VENT | CLOSED | CLOSED | OPEN |

FIG. 11B

GAS-COOLED CLAMP FOR RTP

FIELD OF THE INVENTION

The present invention relates generally to semiconductor thermal processing systems, and more specifically to an apparatus and method for cooling a substrate.

BACKGROUND OF THE INVENTION

Thermal processing of silicon wafers is important for manufacturing modern microelectronics devices. Such processes, including silicide formation, implant anneals, oxidation, diffusion drive-in and chemical vapor deposition (CVD), may be performed using conventional low temperature thermal processing techniques. In contrast, some dopant activation processes are performed at substantially higher temperatures for relatively short durations of time. Such high temperature, short duration thermal processes are often called rapid thermal processes (RTP) or spike anneals. Many microelectronics circuits require feature sizes smaller than one micron and junction depths less than a few hundred angstroms. In order to limit both the lateral and downward diffusion of dopants, as well as to provide a greater degree of control during processing, it is desirable to minimize the duration of high temperature processing.

One approach for minimizing processing time utilizes a heat treatment apparatus such as a single-wafer RTP system. Single-wafer rapid thermal processing of semiconductor wafers provides a technique for fabrication of very-large-scale-integrated (VLSI) and ultra-large-scale-integrated (ULSI) electronic devices. There are several challenges, however, to meeting the thermal requirements of rapid thermal processing. For example, fast rates of change of wafer temperature are typically desired, as well as temperature uniformity across the wafer during the temperature changes.

One significant performance limitation of conventional RTP systems (e.g., in terms of thermal budget or the time the wafer spends above about 950 C) is rapidly cooling the wafer. Current systems typically rely almost exclusively on radiation cooling, which at 1000 C has a maximum heat transfer coefficient (HTC) of only about 22.7 mW/cm$^2$C. In order to improve this performance, gas conduction cooling is needed. A challenge with gas conduction cooling is cooling uniformity across the wafer. In addition, for a spike anneal, one needs to turn-on the cooling gas conduction very quickly once the spike temperature is reached.

Thus there is a need in the art for the ability to readily adjust the wafer temperature during processing as well as provide temperature uniformity thereacross.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention overcomes challenges of the prior art via a gas-cooled clamp (GCC) that exhibits backside pressure control within a gap between the wafer and the clamp. The gap is made quite small (e.g., less than about 1 micron) which makes the volume of gas within the gap small. The small gas volume provides for a fast response time (e.g., on the order of about 10 mS), thereby allowing cooling of the wafer to be activated or deactivated expeditiously. For example, by changing the pressure from about 1 Torr to about 100 Torr, a heat transfer coefficient (HTC) can be controlled from a value less than about 2 mW/cm$^2$C to a value greater than about 400 mW/cm$^2$C. In addition, by establishing a small gap, gas conduction is substantially in the free molecular regime, wherein thermal conduction is independent of the gap and depends primarily on pressure, which can be made substantially uniform across the wafer.

In addition to the rapid cool down provided by the gas-cooled clamp, heat conduction to a hot wall can be enhanced by the present invention using gas conduction. The gas conduction aids in reducing the sensitivity to variations in emissivity caused by device structures on the wafer surface. In order to have significant gas conduction, however, a small gap is needed between the hot surface and the wafer (e.g., less than about 1 mm). Unfortunately, viscous conduction is proportional to 1/gap, so that temperature uniformity depends on maintaining a uniform gap across the wafer. During heating, however, the wafer can deform and warp, for example, as much as 0.5 mm or more. The present invention addresses this problem by clamping the wafer to the clamp surface, thereby ensuring flatness of the wafer during heating.

Therefore the present invention advantageously provides a very fast turn-on of backside, free molecular regime gas conduction to a cold chuck surface. In addition, by establishing conduction in the free molecular regime, cooling is dictated primarily by pressure, thereby enabling fast and uniform ramp-down rates once a spike temperature is reached in rapid thermal processing. In addition, the clamping functionality ensures wafer flatness during ramp-up, thereby enabling fast and uniform temperature ramp-up in thermal processing.

The present invention is directed to a semiconductor thermal processing apparatus and method for thermally cooling a semiconductor substrate. The thermal processing apparatus is operable to efficiently clamp and cool a substrate in a generally uniform manner across the substrate, thereby improving process control. According to one aspect of the present invention, a gas-cooled clamp is disclosed which provides efficient and uniform clamping and cooling of a substrate residing thereon. The gas-cooled clamp, for example, comprises a guard ring and a clamping plate, wherein the clamping plate is operable to generally support and clamp the semiconductor substrate and the guard ring when a vacuum is applied to the gas-cooled clamp.

In one example, the clamping plate comprises a plurality of protrusions, wherein the plurality of protrusions are operable to maintain a first distance between the substrate and the guard ring and the clamping plate. The plurality of protrusions, for example, generally define a plurality of valleys therebetween, wherein a cooling gas may be flowed. The cooling gas, for example, is introduced into the valleys from an environment such as from within a process chamber atmosphere.

According to another exemplary aspect of the invention, the clamping plate comprises one or more gas distribution grooves, wherein the one or more grooves are adapted to interconnect the plurality of valleys, wherein the cooling gas is operable to more quickly flow through the plurality of valleys. The distance which separates the substrate and the guard ring and clamping plate, for example, is sized such that thermal conduction between the clamping plate and the substrate and guard ring is generally permitted in the free molecular regime. The grooves, however, are substantially larger than the gaps and permit gas flow in a viscous regime, thereby facilitating a quick transition to a cooling state. The gas-cooled clamp may further comprise a temperature sensor for detecting a temperature associated with the substrate.

According to another exemplary aspect of the present invention, the clamping plate is operable to float over a base plate, wherein a planarity of the clamping plate is referenced to a planarity of the substrate. The clamping plate, for example, comprises a center portion, a peripheral portion, and an intermediate portion, wherein the center portion is associated with the substrate, the guard ring is associated with the peripheral portion, and both the substrate and the guard ring are associated with the intermediate portion. The intermediate portion, for example, comprises an isothermal gasket, wherein the isothermal gasket is operable to transfer heat between the substrate and the guard ring to facilitate thermal uniformity at the periphery of the wafer.

According to another exemplary aspect of the present invention, a method for cooling a substrate in a thermal processing system is disclosed, wherein the thermal processing system comprises a gas-cooled clamp. The method comprises lowering a substrate to a cooling position, wherein the substrate is generally placed on a plurality of protrusions on a clamping plate. A vacuum is subsequently drawn through a plurality of valleys defined by the plurality of protrusions, wherein a cooling gas is drawn into the plurality of valleys, and wherein the substrate is substantially clamped to the clamping plate. According to another exemplary aspect of the invention, a backside pressure associated with the valleys or gaps is controlled, wherein a generally uniform pressure is maintained across the surface of the substrate, and wherein the substrate and guard ring are cooled by thermal conduction of heat in the free molecular regime from the substrate and guard ring to the clamping plate.

According to still another exemplary aspect of the invention, a temperature associated with the substrate is measured, and a pressure of the cooling gas drawn into the plurality of valleys of the clamping plate is controlled based, at least in part, on the measured temperature, whereby thermal conduction of heat in the molecular regime between the substrate and the clamping plate can be augmented.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 11B is a chart illustrating a valve arrangement of FIG. 11A according to another exemplary aspect of the present invention.

DETAILED DESCRIPTION OF THE INVENTION

Figure 1:
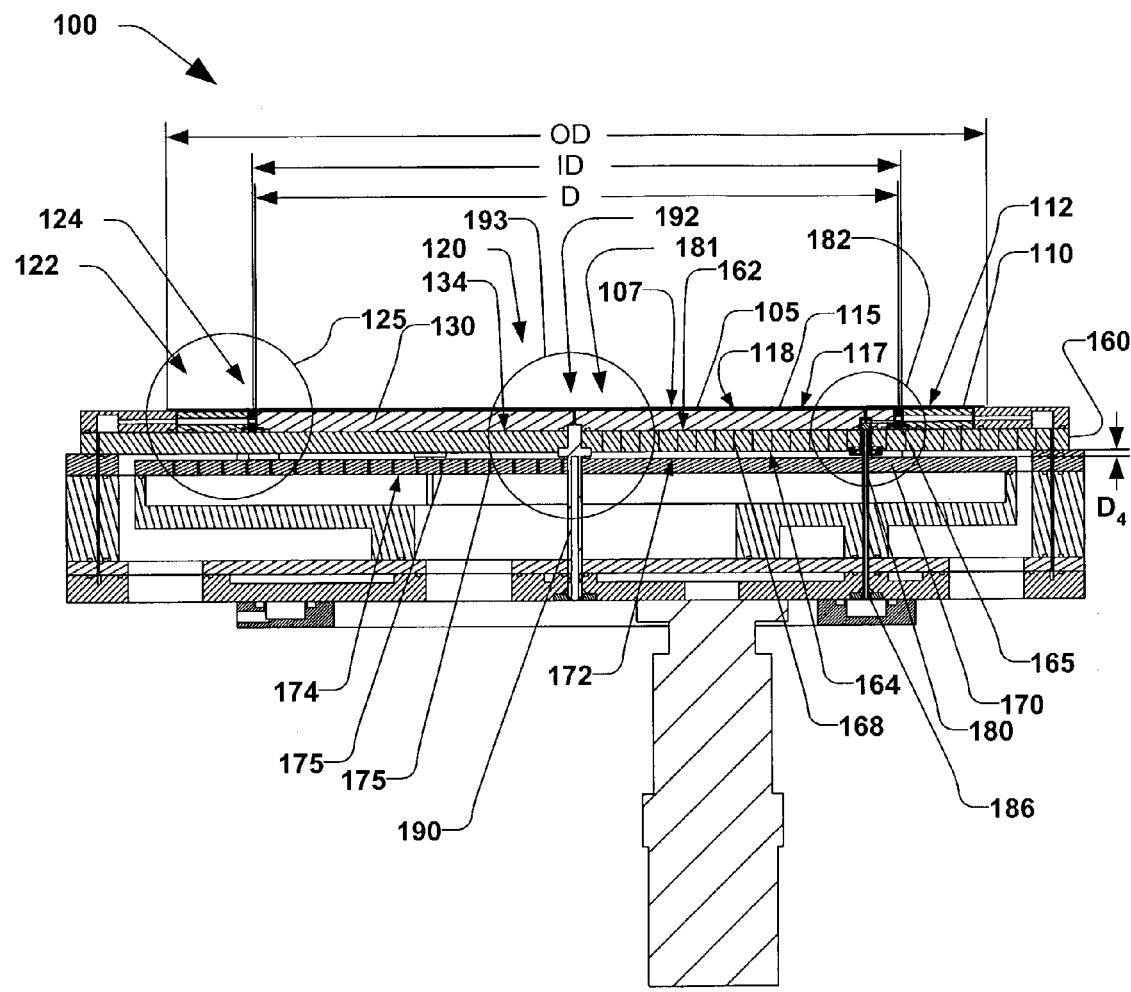
FIG. 1 is a cross-sectional view illustrating an exemplary gas-cooled clamp according to one aspect of the present invention.

The present invention is directed towards a gas-cooled clamp and an associated system and method that incorporate several inventive features that improve a rapid thermal processing (RTP) system. In particular, the gas-cooled clamp of the present invention increases the ability to rapidly and uniformly cool the wafer substrate, for example, after reaching a peak temperature in a spike anneal process. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

The present invention overcomes challenges of the prior art via a gas-cooled clamp that exhibits backside pressure control within a gap between a wafer and the clamp. The gap is made quite small (e.g., less than about 5 microns, such as about 1 micron or less) that makes the volume of gas within the gap small. The small gas volume provides for a fast response time (e.g., on the order of about 10 mS), thereby allowing cooling of the wafer to be activated or deactivated expeditiously. For example, by changing the pressure from about 1 Torr to about 100 Torr, a heat transfer coefficient (HTC) can be controlled from less than about 2 mW/cm$^2$C to a value greater than about 400 mW/cm$^2$C. In addition, by establishing a small gap, gas conduction is independent of the gap distance or size and depends primarily on pressure, which can be made substantially uniform across the wafer.

FIG. 1 of the present invention illustrates an exemplary gas-cooled clamp 100, wherein the gas-cooled clamp is operable to support and cool a substrate 105 residing thereon. The substrate 105, for example, is generally characterized by a diameter D and a top surface (a first surface) 107, wherein the top surface has a first surface area (not shown) associated therewith. The gas-cooled clamp 100 of the present invention comprises a guard ring 110, wherein the guard ring is generally characterized by an inside diameter ID, an outside diameter OD, and a top surface (a second surface) 112 having a second surface area (not shown) associated therewith. The guard ring 110 is generally coaxial with the substrate 105. The inside diameter ID of the guard ring 110, for example, is generally greater than the diameter D of the substrate 105, wherein the guard ring is operable to minimize thermal edge effects during thermal processing of the substrate 105, as will be discussed hereafter. It should be noted that the gas-cooled clamp 100 of FIG. 1 is illustrated macroscopically for simplicity, however, subsequent Figures (e.g., FIGS. 2A, 2B and others) are provided which illustrate exemplary blown-up views of the gas-cooled clamp 100 in further detail.

Figure 2A:
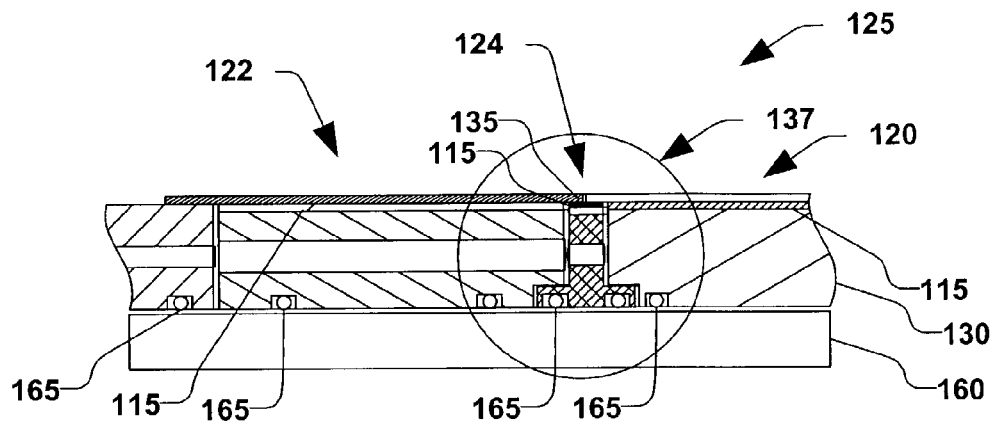
FIG. 2A is a blown up partial cross-sectional view of a portion of the exemplary gas-cooled clamp of FIG. 1 according to an aspect of the present invention.
Figure 2B:
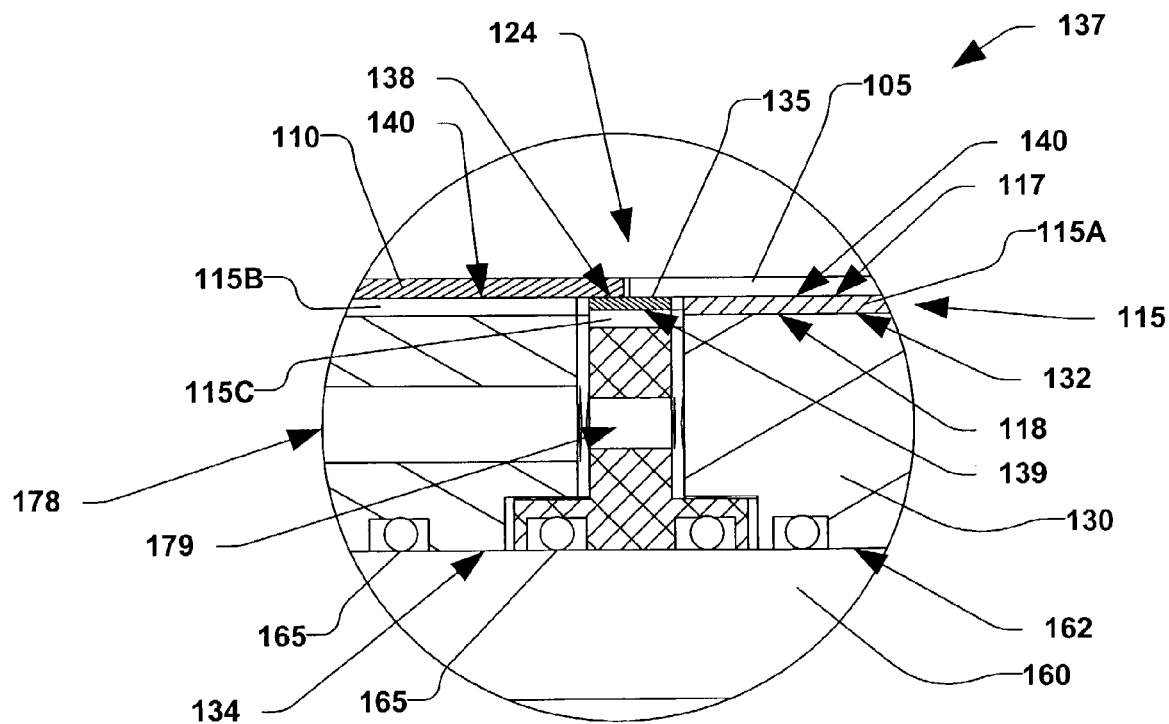
FIG. 2B is a blown up partial cross-sectional view of a portion of the exemplary gas-cooled clamp of FIG. 2A according to an aspect of the present invention.

The gas-cooled clamp 100 of FIG. 1 of the present invention further comprises a generally planar clamping plate 115 having a top surface (a third surface) 117 and an oppositely disposed bottom surface (a fourth surface) 118 (e.g., a third and fourth surface as further illustrated in FIG. 2B). The clamping plate 115, for example, comprises a center portion 120, a peripheral portion 122, and an intermediate portion 124 disposed therebetween, wherein the center portion is associated with the substrate 105, the peripheral portion is associated with a guard ring 110, and the intermediate portion is associated with the substrate and the guard ring. As illustrated in FIG. 2B, for example, the clamping plate 115 is comprised of three non-contiguous portions 115A–115C, wherein the three portions are associated with the respective center portion 120, a peripheral portion 122, and an intermediate portion 124 of the clamping plate. The center portion 120, peripheral portion 122, and intermediate portion 124 of the clamping plate 115, for example, can be physically distinct portions, wherein the center portion, peripheral portion, and intermediate portion are furthermore separated from one another by a predetermined distance (not shown).

FIG. 2A illustrates a blown up cross sectional view of a portion 125 of the gas-cooled clamp 100 of FIG. 1, wherein several exemplary aspects of present invention are illustrated in greater detail. According to one exemplary aspect of the invention, FIG. 2A illustrates the center portion 120, peripheral portion 122, and intermediate portion 124 of the clamping plate 115, wherein the center portion, peripheral portion, and intermediate portion are physically distinct, and individual portions of the clamping plate 115. According to another exemplary aspect of the invention, the clamping plate 115 of FIG. 1 further comprises a support plate 130, wherein the support plate is generally characterized by a top surface (a fifth surface) 132 associated with the bottom surface 118 of the clamping plate 115 and an oppositely disposed bottom surface (a sixth surface) 134. The top surface 132 of the support plate 130, for example, generally faces the bottom surface 118 of the clamping plate 115, wherein the support plate 130 and the clamping plate are thermally coupled to one another. One exemplary method of thermally coupling the support plate 130 to the bottom surface 118 of the clamping plate 115 is accomplished by brazing, wherein the bottom surface 118 of the clamping plate is metallized and then vacuum brazed to the top surface 132 of the support plate. The support plate 130, for example, is comprised of a material that provides good thermal conductivity, such as a metal. Exemplary support plate 130 metals are aluminum, copper, or other metal alloy with good thermal conductivity.

FIG. 2A further illustrates the support plate 130, wherein the intermediate portion 124 of the clamping plate further comprises an isothermal gasket 135. FIG. 2B illustrates a further blown up cross sectional view of a portion 137 of the portion 125 of the gas-cooled clamp 100 illustrated in FIG. 2A, wherein the intermediate portion 124 of the clamping plate 115 is illustrated in greater detail. The isothermal gasket 135 is generally characterized by a top surface (a seventh surface) 138 and oppositely disposed bottom surface (an eighth surface) 139, wherein the top surface of the isothermal gasket is operable to thermally contact a portion of the substrate 105 and a portion of the guard ring 110. Furthermore, the isothermal gasket 135 is operable to transfer heat between the guard ring and the substrate during thermal processing, thereby minimizing edge effects, as will be described in greater detail infra. The isothermal gasket 135, for example, is comprised of a material having a thermal conductivity similar to a thermal conductivity of the substrate 105, for example, silicon (Si) or silicon carbide (SiC).

Figure 3:
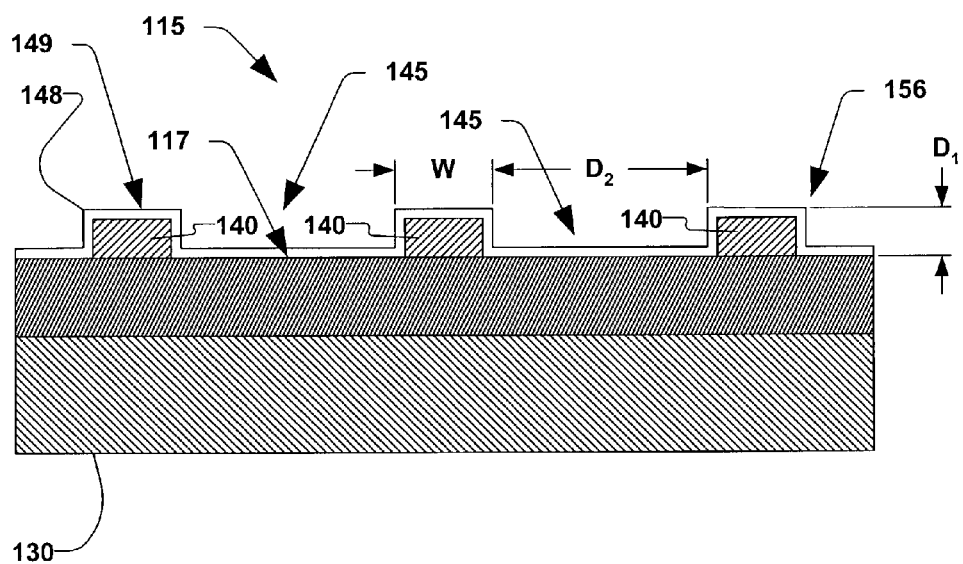
FIG. 3 is a partial cross-sectional view of an exemplary clamping plate having a plurality of protrusions according to an aspect of the present invention.

According to another exemplary aspect of the present invention, as illustrated in partial cross-section in FIG. 3, the clamping plate 115 comprises a plurality of protrusions 140 which generally extend outwardly from the top surface 117 of the clamping plate of FIG. 2B. The plurality of protrusions 140 are associated with the center portion 120, peripheral portion 122, and intermediate portion 124 of the clamping plate 115. Referring again to FIG. 3, the plurality of protrusions 140 extend generally a first distance $D_1$ from the top surface 117 of the clamping plate. Accordingly, the plurality of protrusions 140 generally define a plurality of valleys 145 therebetween, wherein the plurality of protrusions, for example, are spaced from one another by a second distance $D_2$, thereby defining a width of the plurality of valleys. The second distance $D_2$ is generally less than a thickness of the substrate (not shown), whereby mechanical deflection of the substrate during clamping is significantly reduced, as will be discussed in greater detail hereafter. Also, with the exemplary dimensional constraints highlighted above, any effect of the protrusions on the surface temperature of the wafer is minimized. For example, the second distance $D_2$, is less than approximately 100 microns.

According to yet another exemplary aspect of the present invention, the plurality of protrusions 140 are comprised of microelectromechanical system (MEMS) structures. For example, the clamping plate 115 is comprised of a material which is typically utilized in forming MEMS microstructures, such as silicon or a ceramic material. The plurality of protrusions 140, for example, are furthermore comprised of a material wherein thermal contact conductivity between the plurality of protrusions and the substrate (not shown) is minimized. For example, the plurality of protrusions 140 are comprised of silicon dioxide ($SiO_2$), wherein the specific heat of the silicon dioxide is relatively small.

Figure 4A:
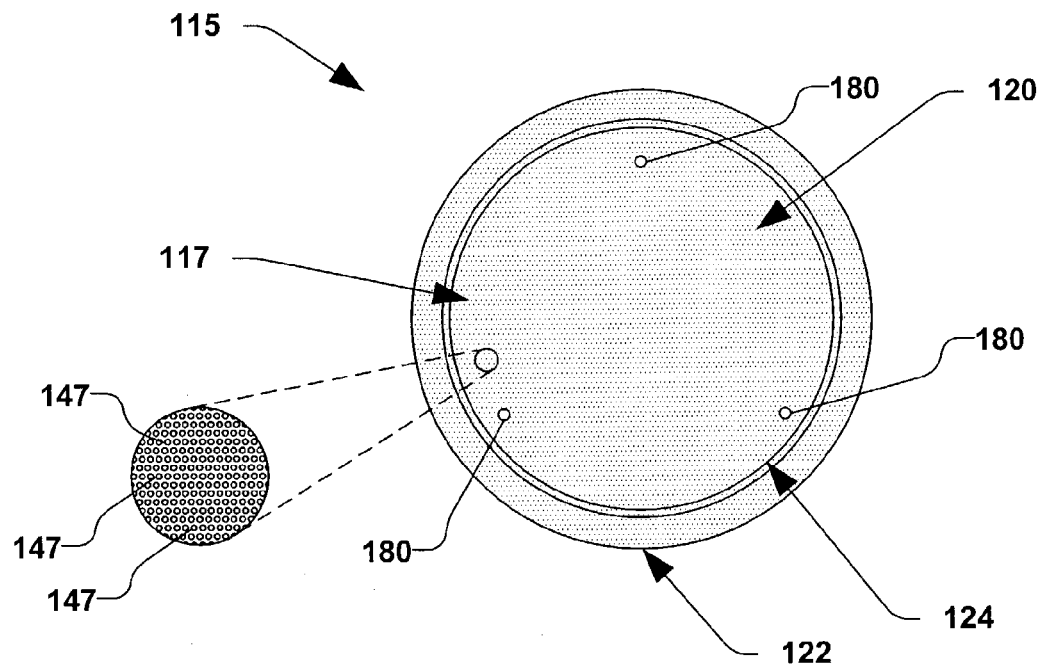
FIG. 4A is a plan view of an exemplary clamping plate having a plurality of protrusions according to an aspect of the present invention.

MEMS microstructures generally provide a tightly-controlled and consistent dimensional integrity across the top surface 117 of the clamping plate 115, wherein the plurality of protrusions 140 extend a generally consistent first distance $D_1$ from the third surface across the clamping plate. For example, FIG. 4A illustrates the plurality of protrusions 140 comprising a plurality of substantially cylindrical or rectangular islands 147 which have been formed over the top surface 117 of the clamping plate 115. The plurality of protrusions 140 generally contact the bottom surface 107 of the substrate 105, the bottom surface 112 of the guard ring 110, and the bottom surface 139 of the isothermal gasket 135 of FIGS. 1, 2A, and 2B, thereby defining a protrusion contact area. Preferably, the protrusion contact area (not shown) is less than about 5% of the total of the bottom surface area of the substrate 105 and the bottom surface area of the guard ring 110. For example, the plurality of islands 147 of FIG. 4 have a diameter of about 10 microns or less, wherein thermal conduction directly through the islands to the substrate 105 and the guard ring 110 is substantially small. Most preferably, the protrusion contact area (not shown) is less than 5% of the total of the surface area of the substrate 105 and the surface area of the guard ring 110.

Although the plurality of protrusions 140 extending from the top surface 117 of the clamping plate 115 are illustrated as being of uniform shape and arranged in an ordered manner, other arrangements of the plurality of protrusions are also contemplated, and any shape or order of protrusions or other such alternatives are contemplated as falling within the scope of the present invention. For example, the plurality of protrusions 140 can be defined by a predetermined roughness of the top surface 117 of the clamping plate 115, wherein the plurality of protrusions extend outwardly a generally consistent first distance $D_1$ across the top surface of the clamping plate. Referring again to FIG. 3, the plurality of protrusions 140 may furthermore comprise, for example, a protective coating 148, such as a silicon nitride ($Si_3N_4$) layer, formed thereover. The protective coating 148, for example, can have a low emissivity, wherein heat emitted from the substrate (not shown) toward the clamping plate 115 is reflected from the protective coating during a heating of the substrate. According to another example, the protective coating 148 provides a substantially hard and inert interface 149 between the clamping plate 115 and the substrate (not shown), wherein the protective coating generally decreases the possibility of contamination from the clamping. According to yet another example, the protective coating 148 is operable to generally permit the substrate (not shown) to slide laterally over the interface 149 between the clamping plate 115 and the substrate, wherein the protective coating generally conforms to the plurality of the protrusions 140, thereby rounding one or more sharp edges 156 thereof.

Figure 4B:
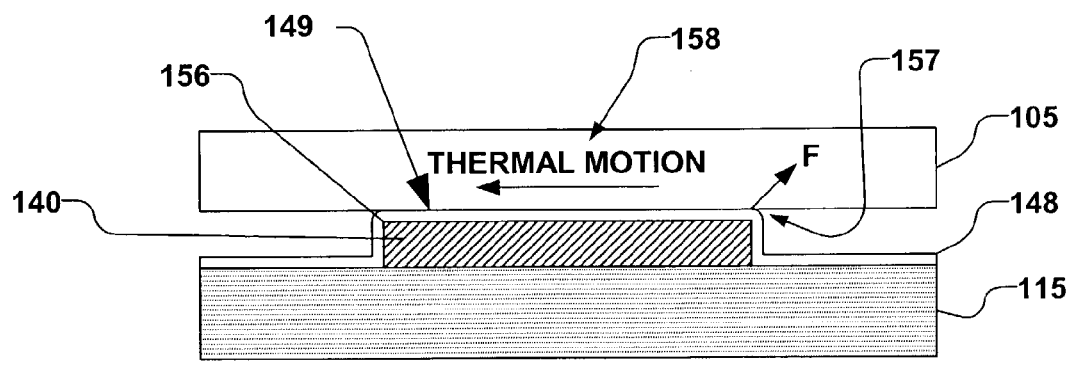
FIG. 4B is a partial cross-sectional view of an exemplary protrusion in accordance with another aspect of the present invention.
Figure 4C:
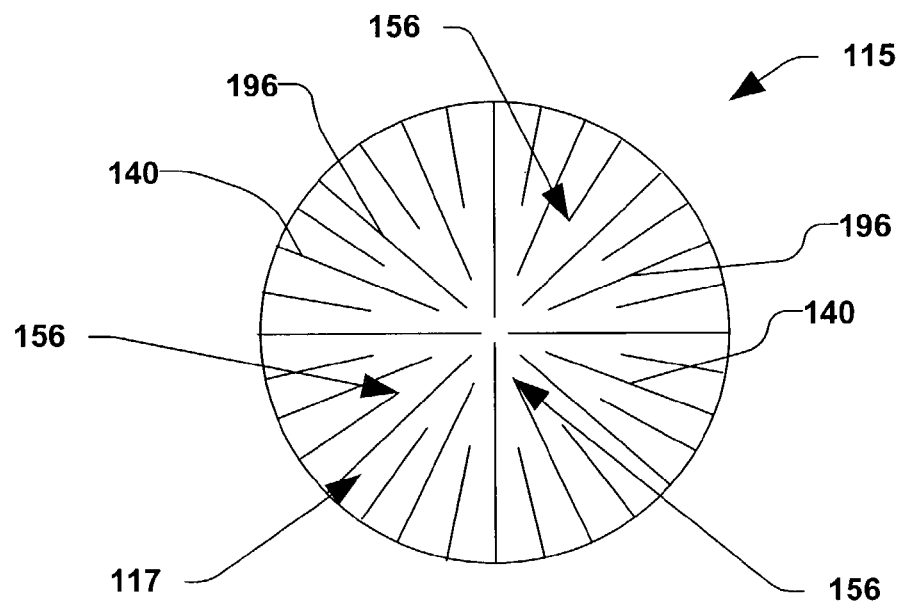
FIG. 4C is a plan view of an exemplary clamping plate having a plurality of low conductivity rails according to yet another aspect of the present invention.

FIG. 4B illustrates an exemplary protrusion 140, wherein the protective coating 148 has generally rounded the one or more sharp edges 156, thereby defining one or more rounded edges 157 of the protrusion. The one or more rounded edges 157, for example, provide advantageous sliding characteristics during a thermal motion (e.g., a thermal expansion or contraction) of the substrate 105 with respect to the clamping plate 115. For example, the thermal motion 158 of the substrate 105 relative to the protrusion 140 can create a force F on the substrate 105 by the protrusion 140. The force F varies depending on, at least in part, the geometry of the protrusion 140. For example, sharp edges 156, as illustrated in FIG. 3, are more likely to create a large force F, wherein the substrate 105 is likely to laterally bind at the sharp edge of the protrusion 140. Stress fractures may appear in the substrate 105, for example, if the force F exceeds the yield strength of the substrate, thereby causing potential contamination and/or damage to the substrate. The rounded edges 157 of FIG. 4B, on the other hand, generally limit the force F on the substrate 105 by spreading the force over the rounded edges. Limiting the force F on the substrate 105 generally permits the substrate to more freely expand or contract with respect to the clamping plate 115, thereby generally limiting lateral binding at the protrusion 140.According to another exemplary aspect of the present invention, as illustrated in FIG. 4C, the plurality of protrusions 140 comprise a plurality of low conductivity rails 196. The plurality of low conductivity rails 196, for example, extend radially across the top surface 117 of the clamping plate 115, and are operable to support the substrate (not shown) on the clamping plate 115. The plurality of low conductivity rails 196, for example, generally minimize a potential for scratching of the substrate (not shown) by minimizing a number of edges 197 of the plurality of protrusions 140 in contact with the substrate. Minimizing the number of edges 197 in contact with the substrate (not shown) furthermore advantageously permits the substrate (not shown) to more easily slide with respect to the plurality of protrusions 140 when the substrate expands and contracts during thermal processing of the substrate.

According to another exemplary aspect of the invention, mechanical pressure between the substrate (not shown) and the plurality of protrusions 140 determines, at least in part, a contact thermal conductivity between the substrate and the clamping plate 115, wherein the contact thermal conductivity generally decreases at low mechanical pressures. Furthermore, wherein the plurality of protrusions 140 comprise a plurality of low conductivity rails 196, the protrusion contact area (not shown) is preferably greater than 40% of the total of the bottom surface area (not shown) of the substrate (not shown).

Figure 4D:
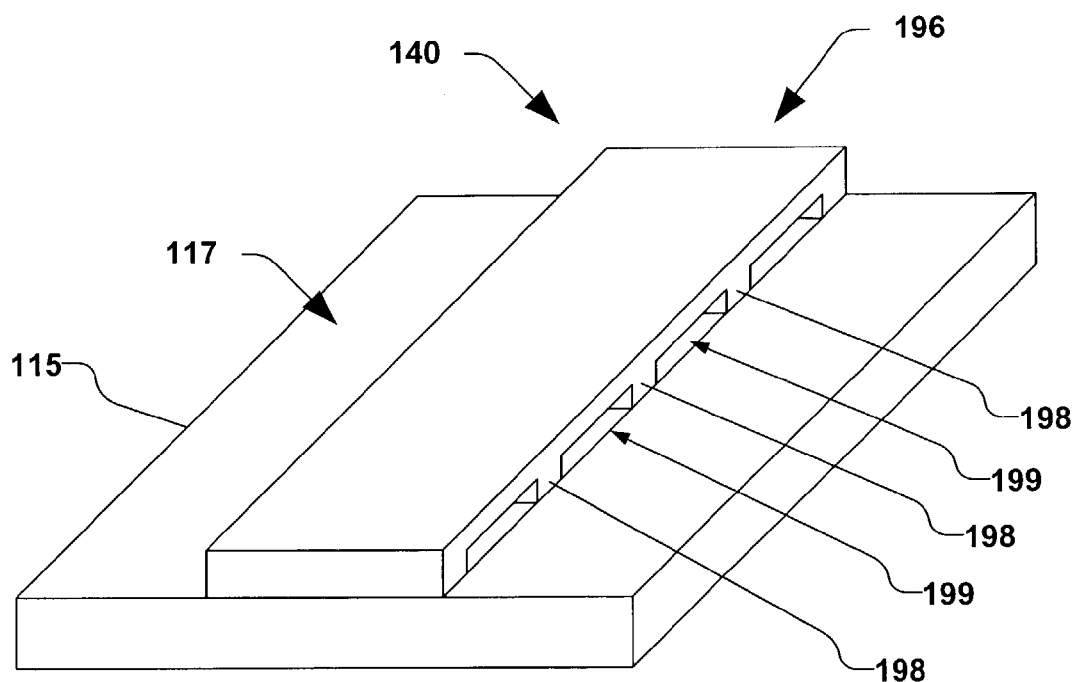
FIG. 4D is a perspective view of an exemplary low conductivity rail according to the present invention.
Figure 4E:
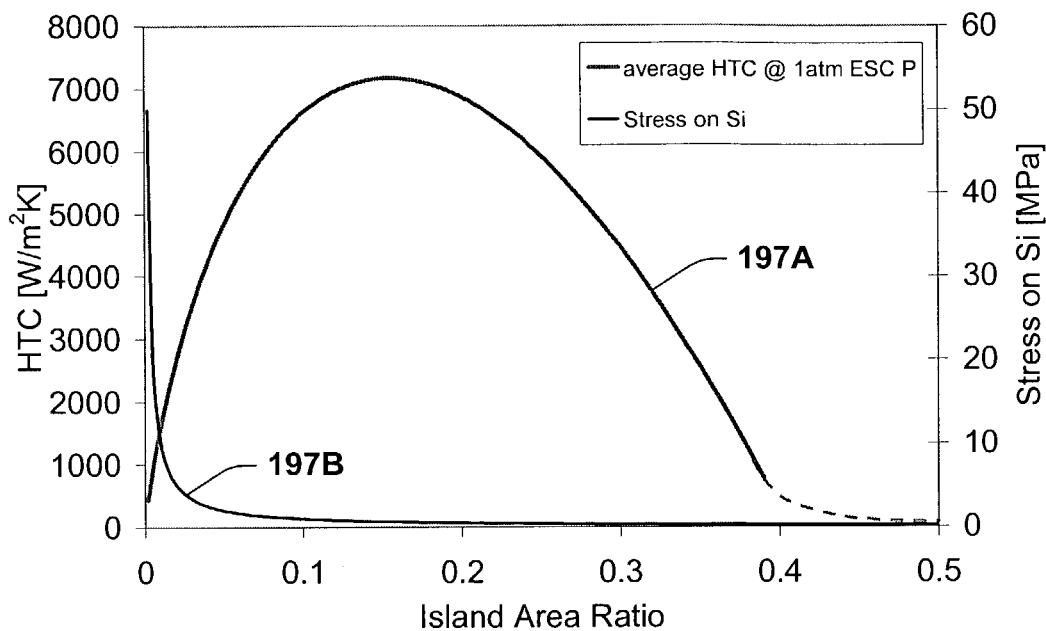
FIG. 4E is a graph of contact heat transfer coefficient and wafer stress for various contact area ratios in accordance with still another exemplary aspect of the invention.

The above phenomena may be more fully appreciated in conjunction with FIG. 4E, which illustrates a graph of the contact HTC and wafer stress for various contact area ratios. For example, at low area contact ratios (e.g., an AR of about 0.05 or less) the contact HTC (graph 197A) is small due to the small contact area between the protrusions and the wafer. While a low contact HTC is desirable (so that thermal conduction is dictated primarily by the thermal conduction of the gas), for such small area ratios the stress (graph 197B) on the wafer is undesirably high.

As the area contact ratio increases (e.g., protrusion contact area of all the protrusions being a larger proportion of the entire wafer area), the contact HTC begins to increase, reach a maximum and decrease again, which reflects the trade-offs that occur due to increased area and reduced contact pressure per unit area on the protrusions. In this range (e.g., between an AR of about 0.05 to about 0.3) the contact HTC is undesirably high which makes turning off the cooling of the clamp difficult or less controlled since the contact HTC is passive and cannot be "turned off" like the gas conduction HTC (turned off by change in pressure). Then at higher contact area ratios, for example, about 0.4 or more, the stress is negligible and the contact HTC is again substantially low such that the activation/deactivation of cooling is dictated primarily by the cooling gas backside pressure. Note that in the above example, due to modeling approximations, the desired AR value was about 0.4 or more. It has been found, however, due to more detailed testing, that the AR value is a function of the surface morphology and may vary. The further testing has found that in general the contact HTC falls off more rapidly, and that the desired AR value is about 0.2 or more.

According to another exemplary aspect of the present invention, FIG. 4D illustrates an exemplary protrusion 140, wherein the protrusion further comprises one or more feet 198 and one or more voids 199 therein. The one or more voids 199 generally reduce a thermal conduction path to the clamping plate 115 by limiting the path for thermal conduction from the substrate (not shown) to the clamping plate 115. As will be understood by one of ordinary skill in the art, the thermal conduction through the protrusion is advantageously generally limited to a transfer through the one or more feet 198.

Referring again to FIG. 2B, according to another exemplary aspect of the present invention, the plurality of protrusions 140 associated with the center portion 120, peripheral portion 122, and intermediate portion 124 of the clamping plate 115 are operable to generally maintain the first distance $D_1$ of FIG. 3 from the top surface 117 of the clamping plate to the bottom surface 107 of the substrate 105 and the bottom surface 112 of the guard ring 110, as well as the bottom surface 139 of the isothermal gasket 135, and are further operable to generally permit a flow of a gas (not shown) within the plurality of valleys 145, wherein the gas-cooled clamp is operable to transfer heat from the substrate and the guard ring to the clamping plate via thermal conduction in the free molecular regime of a cooling gas (not shown). For example, in order to permit thermal conduction in the free molecular regime, the first distance $D_1$ is generally under 5 microns. Preferably, the first distance $D_1$ from the top surface 117 of the clamping plate 115 to the bottom surfaces 107 and 112 of the substrate 105 and clamping plate 110, respectively, is approximately 1 micron or less.

Generally, the behavior of a cooling gas heat transfer coefficient (HTC) across a distance between two bodies falls into one of three operating regimes: the viscous regime, the free molecular regime, and the transition regime. In the viscous regime, the heat transfer coefficient (HTC) is a function of the gap distance and the thermal conductivity of the cooling gas, but generally is independent of the cooling gas pressure (hereinafter referred to as backside gas pressure). In the free molecular regime, the HTC is a function of the backside gas pressure and the molecular weight of the cooling gas, but is independent of the gap distance. The free molecular regime is established substantially with the distance (e.g., the first distance $D_1$) less than a few microns (e.g., about 3–5 microns). Furthermore, the transition regime is characterized by a smooth interpolation between the viscous regime and the molecular regime.

Conduction of heat through a gas in the free molecular regime, as defined by the present invention, provides for several unique advantages. For example, by maintaining the gap (e.g., the distance $D_1$) on the order of the mean free path of the cooling gas, cooling across the wafer is substantially insensitive to the gap distance and instead is primarily a function of the backside pressure, thereby leading to cooling uniformity spatially across the wafer. In addition, since the gap distance is small, the volume associated therewith is also small, thereby allowing a cooling of the wafer to be effectuated extremely quickly by altering the backside pressure. Thus the present invention allows one to quickly cool the wafer once a spike anneal temperature is reached.

Figure 5:
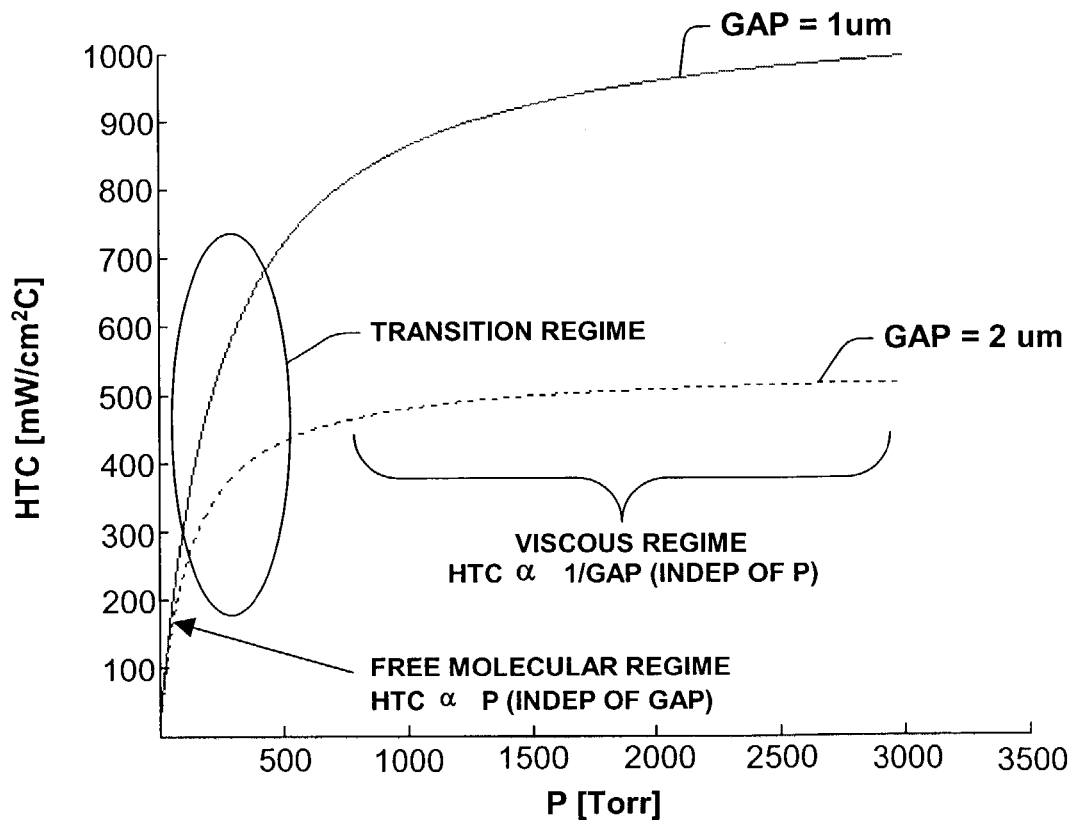
FIG. 5 is a graph illustrating an exemplary heat transfer coefficient of a gas in the molecular and viscous regimes according to an aspect of the present invention.

FIG. 5 is a graph that illustrates the behavior of the HTC versus backside gas pressure for nitrogen at first distances $D_1$ of 1 and 2 microns. The free molecular regime, in which the HTC is predominantly a function of backside gas pressure, is seen for gas pressures in the present example in the range of 0 to about 250 Torr when the first distance $D_1$ is 1 micron, or when the first distance $D_1$ is less than the mean free path (MFP) of the cooling gas. The viscous regime, in which the HTC is a primarily a function of the first distance $D_1$, is seen for backside gas pressures greater than approximately 250 Torr, or when the first distance $D_1$ is greater than the mean free path (MFP) of the cooling gas (not illustrated in the present figure). Between these two regimes, the transition regime is seen.

FIG. 5 further illustrates that in the free molecular regime the cooling gas HTC may be controlled primarily by adjusting the backside gas pressure, however, the first distance $D_1$ still plays a role in the HTC at higher pressures. For example, for a first distance $D_1$ of 2 microns as compared to 1 micron, the thermal conductivity of the cooling gas begins transitioning from the free molecular regime to the viscous regime at approximately 250–275 Torr. Therefore, first distance $D_1$ uniformity is still a concern when varying pressures from atmospheric pressure to substantial vacuum pressures (e.g., less than 20 Torr). However, by controlling the pressure between substantial vacuum and about 250 Torr the HTC can be controlled primarily by the backside pressure independent of slight variations in the gap distance. Therefore cooling uniformity across the wafer is maintained.

Figure 6:
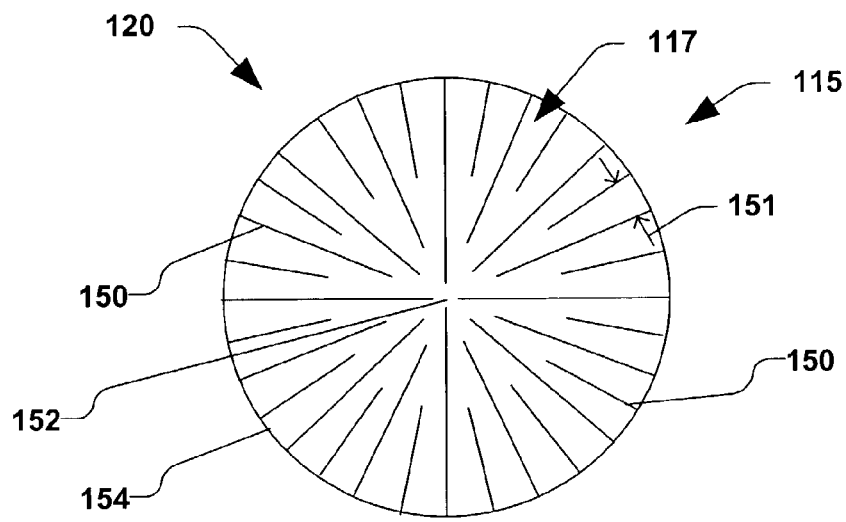
FIG. 6 is a plan view of an exemplary clamping plate comprising a plurality of gas distribution grooves according one aspect of the present invention.
Figure 7A:
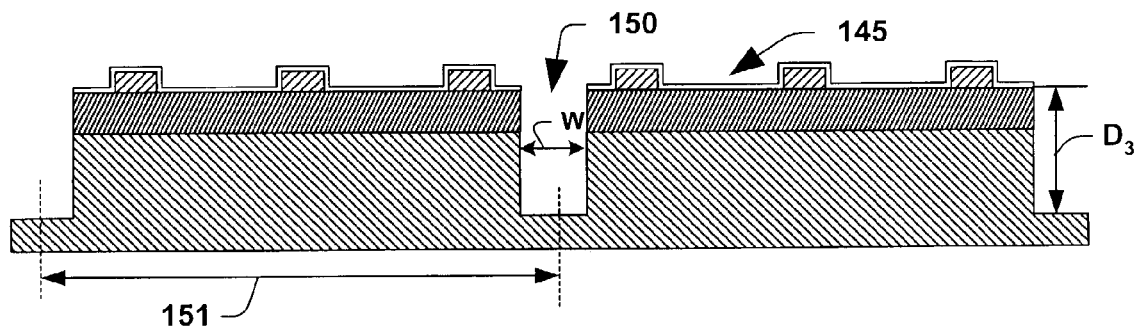
FIG. 7A is a partial cross-sectional view of an exemplary clamping plate illustrating gas distribution grooves.

According to yet another exemplary aspect of the present invention, as illustrated in FIG. 6, the clamping plate 115 comprises one or more gas distribution grooves 150, wherein the gas distribution grooves are adapted to allow the cooling gas (not shown) to flow therethrough, and wherein an adjustment to the pressure of the cooling gas (the backside pressure) can be quickly attained. As illustrated in FIG. 7A, the gas distribution grooves 150 generally extend a third distance $D_3$ into the clamping plate 115, wherein each gas distribution groove intersects at least one of the plurality of valleys 145 of FIG. 3 associated with at least the center portion 120 of the clamping plate. The third distance $D_3$, for example, is less than approximately 100 microns, wherein the flow of the cooling gas within the gas distribution grooves 150 fall into the viscous regime. Furthermore, a significantly larger third distance $D_3$ of the gas distribution groove (compared to the valleys 145) generally permits a fast response time for pumping the cooling gas from the clamping plate 115.

The gas distribution groove 150 is further characterized by a width W generally coplanar with the top surface 117 of the clamping plate 115. The width W of the gas distribution groove 150 is preferably less than 100 microns, or the thickness (not shown) of the substrate 105 residing on the clamping plate 115, such that thermal conduction is substantially uniform across the bottom surface 107 of the substrate, for reasons similar to those discussed above. According to another exemplary aspect, the width of each gas distribution groove 150 is approximately equal to the third distance $D_3$.

By having gas distribution grooves 150 that are substantially large (e.g., compared to the valleys 145 between the protrusions 140), gas flow therethrough is in the viscous regime that is about 50 times greater than the flow rate in the free molecular regime for a given pressure. The fast flow rate of cooling gas through the gas distribution grooves 150 facilitates a fast turn-on for cooling of a substrate. Nevertheless, the total surface area of the grooves is very small compared to the gas contact area to the wafer in the valleys 145. In this respect, FIG. 7A is not drawn to scale (but is instead provided for purposes of illustration), rather the number of valleys 145 between the grooves 150 is quite substantial. For example, for a groove distance 151 of less than about 1 cm, and the protrusions 140 having a diameter of about 10 microns or less, approximately 90 protrusions or more may reside between the grooves. According to another example, the voids 199 illustrated in FIG. 4D generally permit the cooling gas to flow through the protrusion 140, thereby further facilitating a fast turn-on of cooling of the substrate (not shown).

Figure 7B:
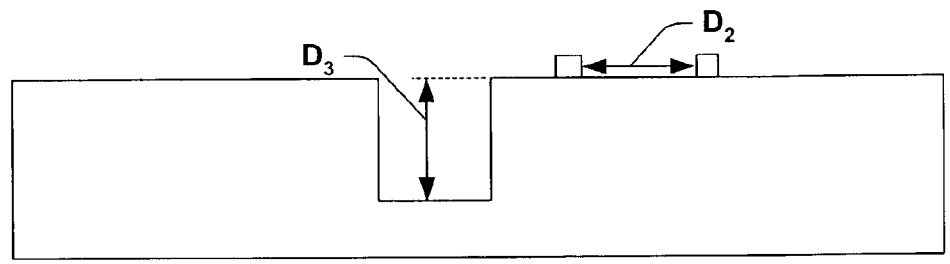
FIG. 7B is a simplified partial cross-section view of an exemplary clamping plate illustrating an exemplary relationship between groove depth and protrusion distance according to one aspect of the present invention.

Accordingly, the plurality of gas distribution grooves 150 are provided, wherein the plurality of gas distribution grooves are operable to significantly decrease a response time for pumping the cooling gas from the clamping plate 115. For example, as illustrated in FIG. 6, the plurality of gas distribution grooves 150 may radiate generally outwardly from a center 152 of the clamping plate 115, wherein the plurality of gas distribution grooves are patterned such that any location on the top surface 117 of the clamping plate is within about 5 mm from at least one of the plurality of gas distribution grooves. Preferably, the distance 151 between the grooves is less than about 1 cm. Although the plurality of gas distribution grooves 150 are illustrated as radially extending grooves, it should be understood that the grooves may be configured in numerous ways, and in varying numbers, and such variations are contemplated as falling within the scope of the present invention. Further, as illustrated in the example of FIG. 7B, a depth $D_3$ of the grooves 150 is approximately the same as a distance $D_2$ between the various protrusions 140.

Figure 8A:
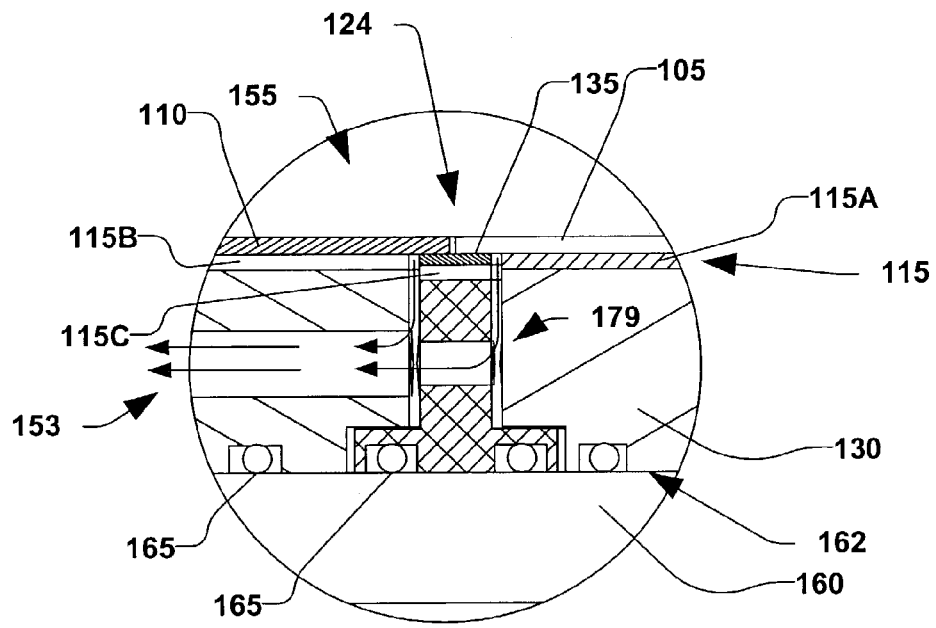
FIGS. 8A and 8B are partial cross-sectional views illustrating cooling gas flow through the clamping plate and base plate according to an aspect of the present invention.
Figure 8B:
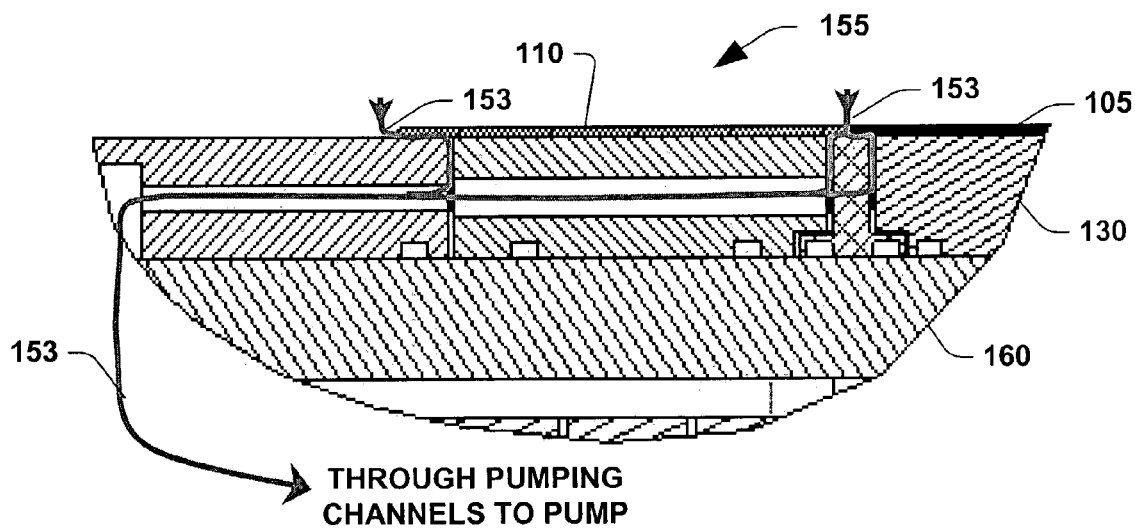

Turning to FIGS. 8A and 8B, examples of cooling gas flow through the clamp is illustrated. The cooling gas 153 of FIGS. 8A and 8B, for example, comprises one or more of substantially thermally conductive gases, such as oxygen, hydrogen, helium, argon, and nitrogen, wherein the cooling gas is generally supplied to an environment 155 such as a process chamber (not shown) containing the gas-cooled clamp 100 of FIG. 1. Therefore, the cooling gas 153 is pumped from the environment 155 (e.g., from within the process chamber (not shown)) through the gas-cooled clamp 100, and out to an appropriate pump (not shown).

According to another exemplary aspect of the present invention, the gas-cooled clamp 100 of FIG. 1 further comprises a base plate 160 having a top surface (a ninth surface) 162 and oppositely disposed bottom surface (a tenth surface) 164, wherein the top surface of the base plate generally faces the bottom surface 134 of the support plate 130. According to yet another exemplary aspect of the present invention, the center portion 120, peripheral portion 122, and intermediate portion 124 of the clamping plate 115 are operable to independently vertically translate with respect to the base plate 160, such that the clamping plate is operable to conform to a flatness of the substrate 105. For example, as illustrated in FIG. 2A, one or more O-rings 165 are associated with each of the center portion 120, peripheral portion 122, and intermediate portion 124 of the clamping plate 115. The one or more O-rings 165 are further associated with the bottom surface 134 of the support plate 130 and the top surface 162 of the base plate 160. The one or more O-rings 165, for example, are generally compliant, whereby the center portion 120, peripheral portion 122, and intermediate portion 124 of the clamping plate 115 are operable to individually vertically translate in accordance with the compliance of the one or more o-rings. Permitting the center portion 120, peripheral portion 122, and intermediate portion 124 of the clamping plate 115 to vertically translate individually generally permits the clamping plate to be referenced to a surface flatness (not shown) of the substrate 105, as will be understood by one of ordinary skill in the art.

Referring again to FIG. 1, the base plate 160, for example, further comprises one or more first fluid conduits 168, wherein the one or more first fluid conduits are operable to generally permit a cooling fluid (not shown), such as water, to flow between the bottom surface 164 of the base plate and the bottom surface 134 of the support plate 130. The cooling fluid (not shown) thereby thermally couples the base plate 160 and the support plate 130. The base plate 160, for example, is furthermore comprised of a material that provides good thermal conductivity, such as a metal. Preferable metals to be utilized for the base plate 160 comprise aluminum, copper, or other metal alloy with good thermal conductivity. According to another exemplary aspect of the invention, the one or more O-rings 165 generally isolate the cooling fluid (not shown) from coming into contact with the cooling gas (not shown), as will be understood by one of ordinary skill in the art.

FIG. 1 further illustrates another exemplary aspect of the present invention, wherein the gas-cooled clamp 100 further comprises a diffusion plate 170. The diffusion plate 170 comprises a top surface (an eleventh surface) 172 and an oppositely disposed bottom surface (a twelfth surface) 173, wherein the top surface of the diffusion plate is spaced a fourth distance $D_4$ from the bottom surface 164 of the base plate 160. The diffusion plate 170 further comprises, for example, one or more second fluid conduits 175, wherein the one or more second fluid conduits are operable to generally direct a flow of the cooling fluid (not shown) toward the bottom surface 164 of the base plate 160, thereby impinging thereupon and cooling the base plate 160, as will be appreciated by one of ordinary skill in the art.

Now referring again to FIGS. 8A and 8B, another exemplary aspect of the invention is illustrated, wherein a gas conduit 178 is provided, wherein the gas conduit is operatively coupled to at least one of the plurality of valleys 145. For example, the gas conduit 178 is coupled to one of the gas distribution grooves 150, such as the peripheral gas distribution groove 154, wherein the gas conduit is operatively coupled to a vacuum pump (not shown) to permit the application of vacuum to the plurality of valleys 145. The gas conduit 178 is sized such that a high flow rate may be achieved through the gas conduit. For example, FIG. 8B illustrates a radial gas conduit 179 which can interconnect the center portion 120, peripheral portion 122, and intermediate portion 124 of the clamping plate 115, wherein the cooling gas can flow through the support plate 130, and wherein a plurality of radial gas conduits generally permit a high flow of the cooling gas.

Figure 9:
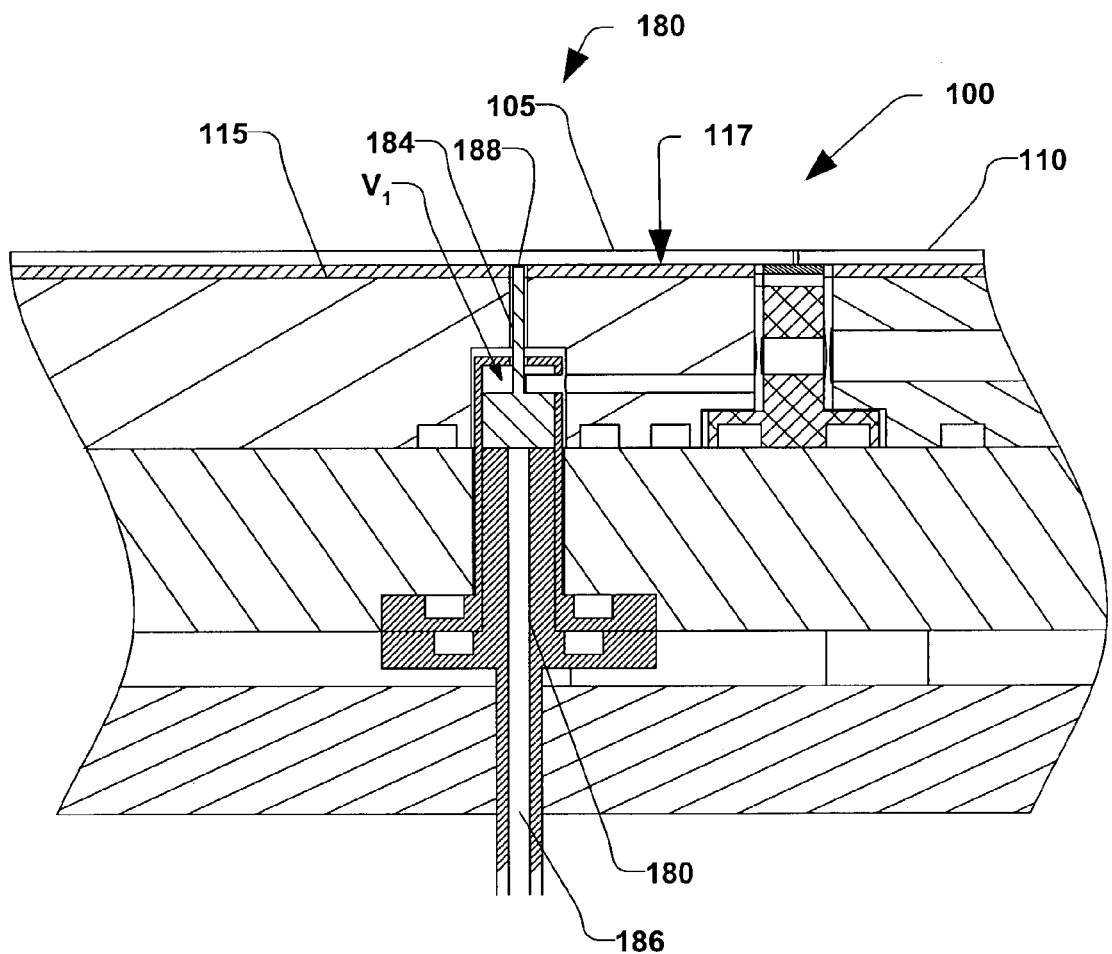
FIG. 9 is a partial cross-sectional view of an exemplary lifting pin according to the one aspect of the present invention.

Referring again to FIG. 1, according to another exemplary aspect of the invention, a plurality of lift pins 180 are operatively coupled to the clamping plate 115, wherein the plurality of lift pins 180 are operable to vertically translate the substrate 105 between a processing position 181 proximate to the clamping plate 115 and a loading position (not shown) generally above the clamping plate 115 (e.g., approximately 1–2 mm above the clamping plate). For example, three lift pins 180 are operatively coupled to the clamping plate 115 to translate the substrate 105 between the loading position (not shown) and the processing position 181. FIG. 9 illustrates a blown-up portion 182 of the gas-cooled clamp 100 of FIG. 1, wherein a partial cross-sectional view of an exemplary lifting pin 180 is shown. The plurality of lift pins 180, for example, comprise a plurality of pneumatically-actuated pins 184, wherein the plurality of pneumatically-actuated pins are operable to linearly translate with respect to the clamping plate 115 when an actuation pressure (not shown) is induced in an actuator 186 associated with the plurality of lift pins 180. For example, the pin 184 is operable to extend vertically from the clamping plate 115 when placed in the loading position (not shown), wherein a tip 188 of the pin is operable to contact and support the substrate 105. The pins 184 are further operable to place the substrate 105 in contact with the third surface 117 of the clamping plate 115, as illustrated in FIG. 1 wherein the tips 188 of each of the pins 184 translate below the third surface 117 of the clamping plate 115.

The pins 184, for example, are comprised of quartz, silicon carbide, or a ceramic material, wherein contamination of the substrate 105 from the pins during thermal processing is minimized. Furthermore, the pins 184 have a generally small diameter (e.g., 1 or 2 mm) that will significantly limit a volume $V_1$ occupied by the pins within the gas-cooled clamp 100 when the pins are in the processing position. Minimizing the volume $V_1$ occupied by the pins 184 while in the processing position is advantageous, wherein the backside pressure can be quickly modified, as will be understood by one of ordinary skill in the art.

Figure 10:
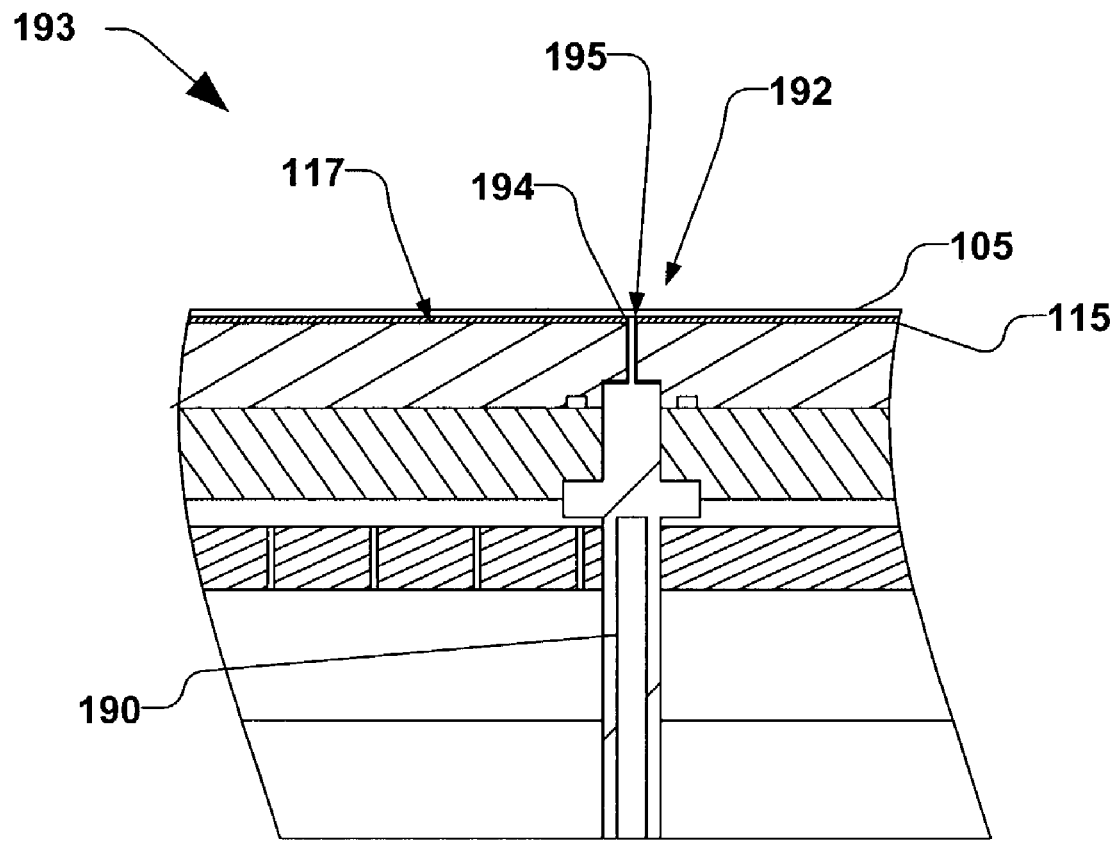
FIG. 10 is a partial cross-sectional view of an exemplary temperature sensor according one aspect of the present invention.

According to still another exemplary aspect of the present invention, as illustrated in FIG. 1, the gas-cooled clamp 100 further comprises a temperature sensor 190 operable to measure one or more temperatures T at a location 192 associated with the substrate 105. FIG. 10 illustrates a blown-up portion 193 of the gas-cooled clamp 100 of FIG. 1, wherein a partial cross-sectional view of an exemplary temperature sensor 190 is shown. For example, the temperature sensor 190 comprises a pyrometer, wherein the pyrometer measures the temperature T of the substrate 105 through an opening 194 in the third surface 117 of the clamping plate 115. The temperature sensor 190 may comprise, for example, a pyrometer having a minimal volume cavity 195, wherein the opening 194 through which the pyrometer measures the temperature T of the substrate 105 is small. Minimizing the volume of the opening is advantageous, wherein the backside pressure can be quickly modified, as will be understood by one of ordinary skill in the art. Alternatively, the temperature sensor 190 may comprise an optical pyrometer that may furthermore utilize fiber optic rods (not shown) inserted into the clamping plate 115 such that the fiber optic rod occupies the minimal volume cavity.

Figure 11A:
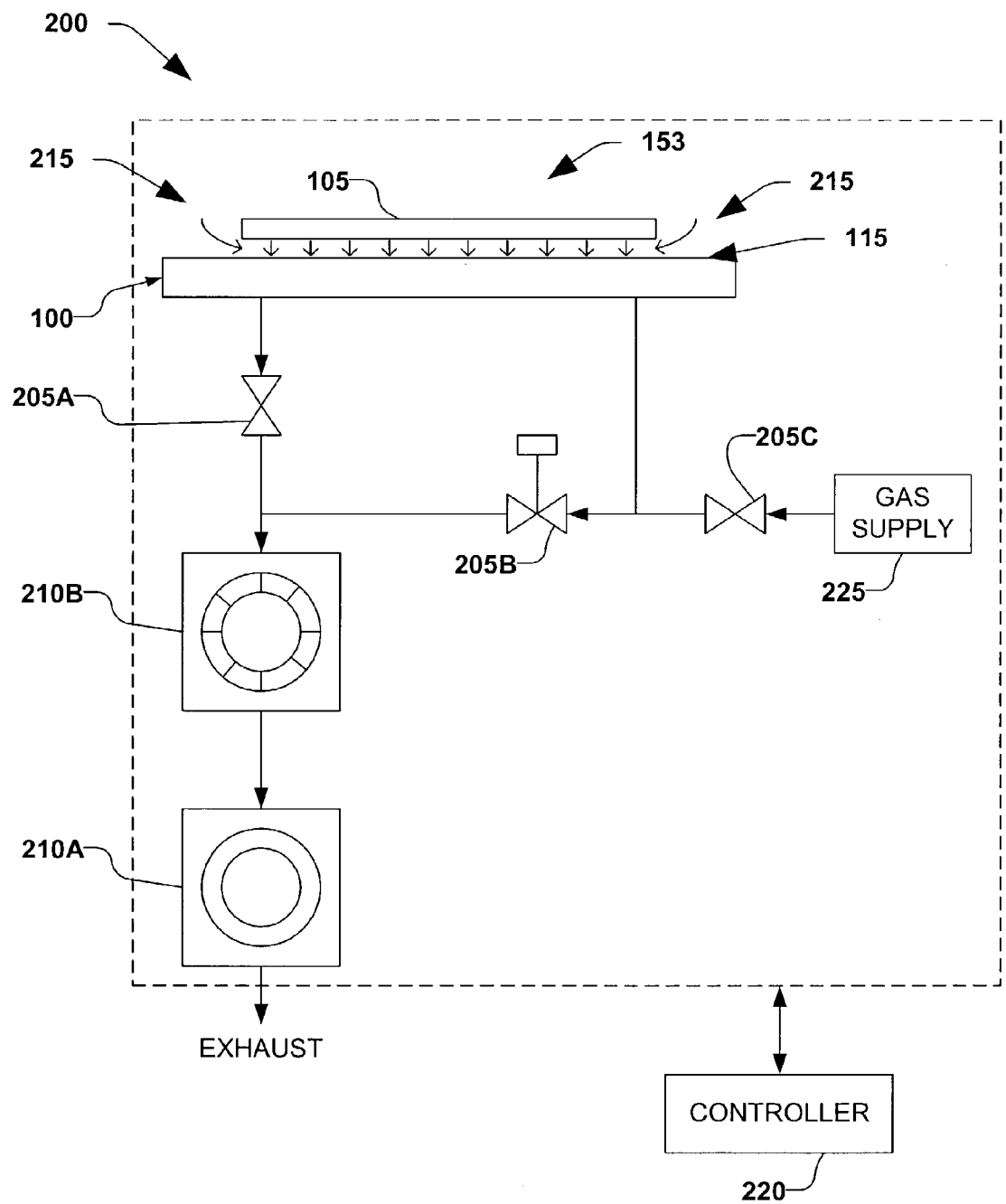
FIG. 11A is a system-level block diagram of an exemplary gas-cooled clamp according an aspect of the present invention.

Referring now to FIG. 11A, a block diagram of the gas-cooled clamp 100 and a related system 200 is illustrated, wherein the gas-cooled clamp further comprises one or more valves 205. The one or more valves 205 selectively permit one or more vacuum pumps 210 to pump the cooling gas 215 through the gas-cooled clamp 100 in various modes. The one or more valves 205, for example, comprise one or more automatic valves (e.g., valve 205A) such as fast-acting solenoid valves or poppet valves, wherein, in one example, the one or more automatic valves have a response time of less than about 20 ms. Such a fast response time is advantageous, since the vacuum applied to the gas-cooled clamp 100 can be quickly applied.

According to another exemplary aspect of the present invention, the system 200 for controlling the gas-cooled clamp comprises a controller 220 operatively coupled to the one or more vacuum pumps 210A–210B, a gas supply 225, and the one or more valves 205A–205C. Controlling the vacuum applied to the gas-cooled clamp 100 advantageously controls an amount of thermal conduction through the cooling gas. For example, at low pressures less than about 250 Torr and a gap distance of less than about 5 microns, the HTC is dictated primarily by pressure. Therefore the valve 205A that controls the backside pressure allows the gas-cooled clamp to quickly change states (e.g., to a cooling condition. The controller 220, therefore, is operable to control a pressure between the substrate 105 and the gas-cooled clamp 100 via controlling the one or more automatic valves 205, as illustrated in the chart of FIG. 11B.

The present invention is also directed toward a method for thermally processing a semiconductor substrate. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Figure 12:
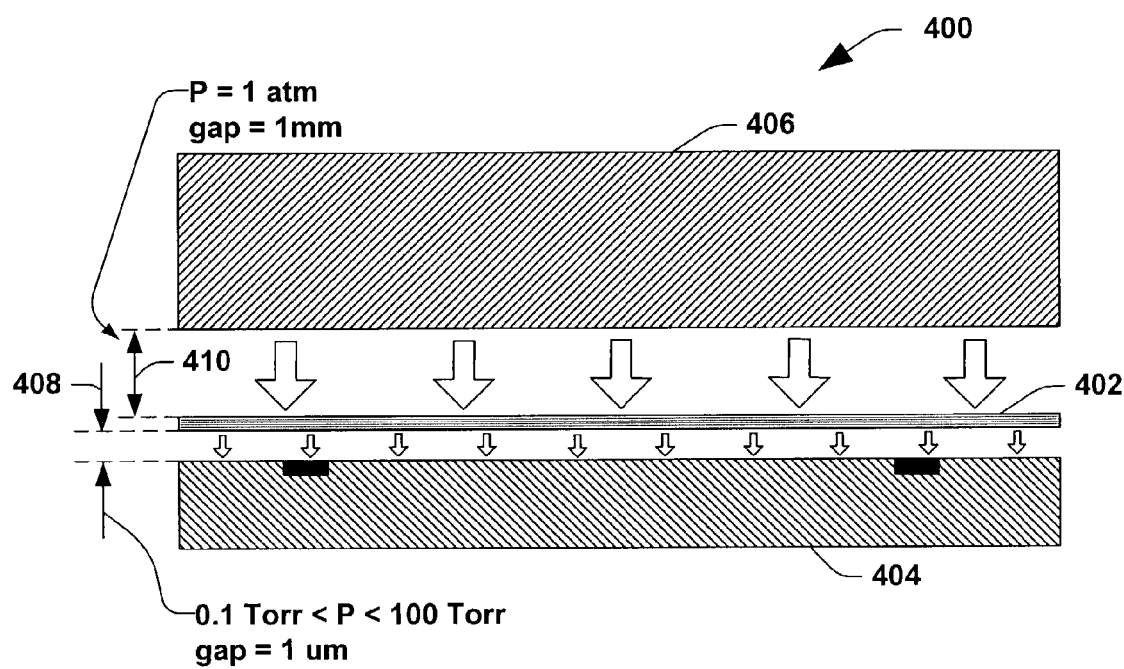
FIG. 12 is a partial cross-sectional view illustrating a simplified thermal processing system employing a gas-cooled clamp according to the present invention.

Initially, the method 300 of the present invention can be discussed in conjunction with the exemplary system 400 of FIG. 12. The system 400 comprises a substrate 402 selectively residing on a gas-cooled clamp 404 similar to that described herein. The substrate 402 is also local to a heat source 406. A distance 408 between the substrate 402 and the clamp 404 is small (e.g., about 1 um) which allows gas conduction in the free molecular regime for appropriate pressures (e.g., 0.1 Torr<P<100 Torr). A distance 410 between the heat source 406 and the substrate 402 is relatively large (e.g., about 1 mm or more) and heating of the substrate occurs at relatively higher pressure (e.g., about 1 atmosphere). Thus by controlling the backside pressure (as discussed above in conjunction with FIGS. 11A and 11B) the system 400 can quickly transition from heating to cooling in an advantageous manner.

Figure 13:
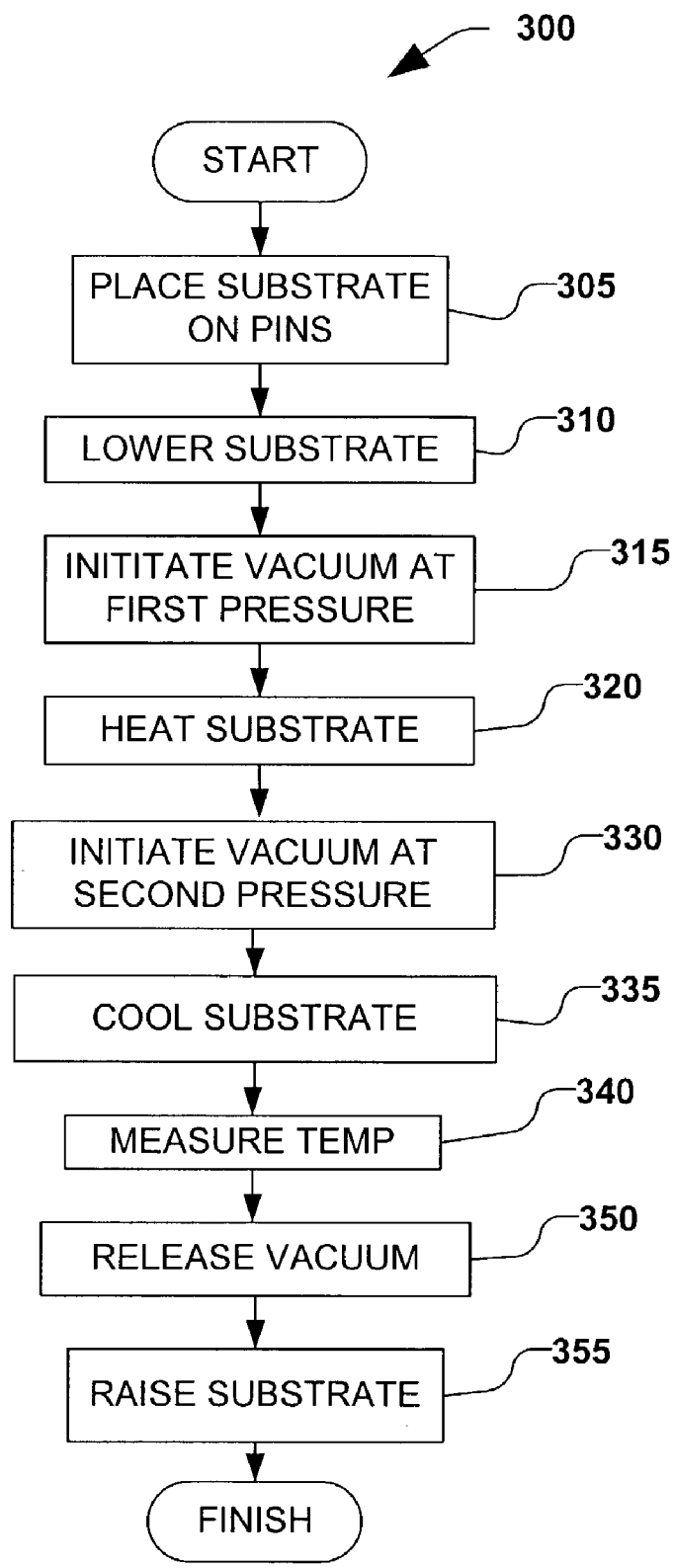
FIG. 13 is a flow chart diagram illustrating an exemplary methodology for thermally processing a semiconductor substrate according to the present invention.

FIG. 13 illustrates an exemplary method 300 of cooling a semiconductor substrate. In act 305, a substrate is placed on a plurality of lift pins when the lift pins are in a loading position. For example, the plurality of pins extend generally from a surface of a clamping plate when the plurality of pins are in the loading position. According to one exemplary aspect of the invention, the plurality of pins extend a minimal distance (e.g., less than 1 mm) from the top surface of the clamping plate when the holder is in the loading position. The pins are then lowered in act 310, wherein the substrate is allowed to rest on a plurality of protrusions extending from the top surface of the clamping plate, and wherein a guard ring generally resides around a perimeter of the substrate on the clamping plate. According to one exemplary aspect of the invention, the plurality of protrusions extend a first distance from the surface of the clamping plate, such as a distance of less than 10 microns (e.g., about 1 micron).

A vacuum or very low backside pressure (e.g., about 0.1 Torr) is applied to the clamping plate in act 315, wherein a backside pressure between the substrate and guard ring and the clamping plate is attained such that the substrate and guard ring are substantially clamped to the clamping plate. The vacuum applied in act 315 furthermore brings a cooling gas into a plurality of valleys defined by the plurality of protrusions, wherein the cooling gas is generally maintained at a first pressure. In act 320, the substrate is heated, wherein heat from the substrate does not significantly transfer through the cooling gas at the first pressure. In act 325, the clamping plate is cooled, such as by flowing a cooling fluid over the support plate associated with the clamping plate. In act 330, the pump(s) generally apply a second backside pressure (e.g., about 100 Torr), wherein the second pressure generally maintains the cooling gas in the molecular regime. Such a pressure can be obtained, for example, by closing the valve 205A of FIG. 11A. In act 335, the substrate is cooled by transferring heat to the clamping plate in the molecular regime.

According to one exemplary aspect of the present invention, in act 340, a temperature associated with one or more locations on the substrate is measured. If the determination made in act 345 is such that the process is not cooling in the desired time frame, for example, the second pressure can be modified in accordance with the measured temperature. The process continues to act 350, wherein the vacuum is halted or otherwise decreased, wherein the vacuum is released, thereby substantially halting the cooling of the substrate. The method concludes with act 355, wherein the lifting pins are raised into the loading position, wherein the substrate is lifted from the third surface of the clamping plate.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A gas-cooled clamp for cooling a substrate residing thereon, comprising:
   a clamping plate having a plurality of protrusions on a top surface thereof and defining a plurality of gaps therebetween and a gap distance when the substrate resides thereon, wherein a cooling gas resides therein, wherein the clamping plate further comprises:
   a center portion over which the substrate resides;
   a peripheral portion; and
   an intermediate portion disposed between the center portion and the peripheral portion, the intermediate portion associated with a portion of the substrate;
   a guard ring surrounding and generally planar with the substrate when the substrate resides on the center portion of the clamping plate, the guard ring overlying the peripheral portion of the clamping plate, wherein the guard ring is configured to minimize thermal non-uniformity in the substrate due to edge effects;
   an isothermal gasket overlying the intermediate portion of the clamping plate, and operable to facilitate uniform heat transfer between the guard ring and the substrate; and
   a pressure control system operable to control a backside pressure of the cooling gas within the plurality of gaps between a first pressure and a second pressure, wherein a heat transfer coefficient of the cooling gas is primarily a function of pressure between the first and second pressures.

2. The gas-cooled clamp of claim 1, wherein the clamping plate further comprises one or more gas distribution grooves formed on the top surface thereof and each intersecting one or more of the plurality of gaps, the one or more gas distribution grooves being substantially larger than the gaps such that a cooling gas flow therethrough occurs in the viscous regime, thereby allowing a cooling of the substrate to be quickly initiated.

3. The gas-cooled clamp of claim 1, wherein a ratio of a contact area of the plurality of protrusions to a wafer surface area is about 0.2 or more.

4. The gas-cooled clamp of claim 1, further comprising a support plate underlying and thermally coupled to the clamping plate.

5. The gas-cooled clamp of claim 4, further comprising a base plate underlying the support plate, wherein the base plate further comprises one or more first fluid conduits operable to generally permit a cooling fluid to flow between the base plate and the support plate.

6. The gas-cooled clamp of claim 1, wherein the plurality of protrusions further comprise a protection layer formed thereover, wherein the protection layer rounds corners associated with the plurality of protrusions.

7. The gas-cooled clamp of claim 1, further comprising a gas conduit fluidly coupled between the pressure control system and at least one of the plurality of gaps, wherein the gas conduit is operable to permit a range of backside pressures of the cooling gas within the plurality of gaps in response to the pressure control system.

8. A gas-cooled clamp for cooling a substrate residing thereon, comprising:
   a clamping plate having a plurality of protrusions on a top surface thereof and defining a plurality of gaps therebetween and a gap distance when the substrate resides thereon, wherein a cooling gas resides therein, wherein the plurality of protrusions comprise a plurality of rails, and wherein the rails are configured to define a plurality of voids therethrough and a plurality of feet structures supporting the rails; and
   a pressure control system operable to control a backside pressure of the cooling gas within the plurality of gaps between a first pressure and a second pressure, wherein a heat transfer coefficient of the cooling gas is primarily a function of pressure between the first and second pressures.

9. A gas-cooled clamp for cooling a substrate residing thereon, comprising:
   a clamping plate having a plurality of protrusions on a top surface thereof and defining a plurality of gaps therebetween and a gap distance when the substrate resides thereon, wherein a cooling gas resides therein;
   a support plate underlying and thermally coupled to the clamping plate;

a base plate underlying the support plate, wherein the base plate further comprises one or more first fluid conduits operable to generally permit a cooling fluid to flow between the base plate and the support plate;

a diffusion plate underlying and spaced from the base plate, wherein the diffusion plate further comprises one or more second fluid conduits operable to generally direct a flow of the cooling fluid toward the base plate; and a pressure control system operable to control a backside pressure of the cooling gas within the plurality of gaps between a first pressure and a second pressure, wherein a heat transfer coefficient of the cooling gas is primarily a function of pressure between the first and second pressures.

10. A gas-cooled clamp for cooling a substrate residing thereon, comprising:

a clamping plate having a plurality of protrusions on a top surface thereof and defining a plurality of gaps therebetween and a gap distance when the substrate resides thereon, wherein a cooling gas resides therein;

a support plate underlying and thermally coupled to the clamping plate, wherein the clamping plate further comprises one or more O-rings associated with a bottom surface thereof facing the support plate, wherein the O-rings are operable to permit a vertical translation of the clamping plate; and a pressure control system operable to control a backside pressure of the cooling gas within the plurality of gaps between a first pressure and a second pressure, wherein a heat transfer coefficient of the cooling gas is primarily a function of pressure between the first and second pressures.

11. The gas-cooled clamp of claim 10, wherein the clamping plate further comprises:

a center portion over which the substrate resides;

a peripheral portion; and an intermediate portion disposed between the center portion and the peripheral portion, the intermediate portion associated with a portion of the substrate.

12. The gas-cooled clamp of claim 11, further comprising a guard ring surrounding and generally planar with the substrate when the substrate resides on the center portion of the clamping plate, the guard ring overlying the peripheral portion of the clamping plate, wherein the guard ring is configured to minimize thermal non-uniformity in the substrate due to edge effects.

13. The gas-cooled clamp of claim 10, wherein the clamping plate further comprises one or more gas distribution grooves formed on the top surface thereof and each intersecting one or more of the plurality of gaps, the one or more gas distribution grooves being substantially larger than the gaps such that a cooling gas flow therethrough occurs in the viscous regime, thereby allowing a cooling of the substrate to be quickly initiated.

14. The gas-cooled clamp of claim 10, wherein a ratio of a contact area of the plurality of protrusions to a wafer surface area is about 0.2 or more.

15. A gas-cooled clamp for cooling a substrate residing thereon, comprising:

a clamping plate having a plurality of protrusions on a top surface thereof and defining a plurality of gaps therebetween and a gap distance when the substrate resides thereon, wherein a cooling gas resides therein, wherein the clamping plate further comprises:

a center portion over which the substrate resides;

a peripheral portion; and an intermediate portion disposed between the center portion and the peripheral portion, the intermediate portion associated with a portion of the substrate, and wherein the center portion, peripheral portion, and intermediate portion are separate portions of the clamping plate, wherein the center portion, peripheral portion, and intermediate portion are operable to independently vertically translate; and a pressure control system operable to control a backside pressure of the cooling gas within the plurality of gaps between a first pressure and a second pressure, wherein a heat transfer coefficient of the cooling gas is primarily a function of pressure between the first and second pressures.

16. The gas-cooled clamp of claim 15, further comprising a support plate underlying and thermally coupled to the clamping plate.

17. The gas-cooled clamp of claim 16, further comprising a base plate underlying the support plate, wherein the base plate further comprises one or more first fluid conduits operable to generally permit a cooling fluid to flow between the base plate and the support plate.

18. A gas-cooled clamp for selectively cooling a substrate thereon, comprising:

a guard ring having an inside diameter that is greater than a diameter of the substrate;

a clamping plate having a top surface for support of the substrate thereon, the clamping plate further comprising:

a center portion supporting the substrate;

a peripheral portion supporting the guard ring;

an intermediate portion disposed between the center portion and the peripheral portion, the intermediate portion supporting a peripheral edge portion of the substrate and an inside diameter portion of the guard ring; and a plurality of protrusions associated with at least the top surface of the center portion of the clamping plate, the plurality of protrusions defining a plurality of gaps therebetween and a gap distance when the substrate resides thereon, wherein a cooling gas resides therein, and wherein the plurality of protrusions comprise a plurality of rails, wherein the rails are configured to define a plurality of voids therethrough and a plurality of feet structures supporting the rails; and a pressure control system operable to control a backside pressure of the cooling gas within the plurality of gaps between a first pressure and a second pressure, wherein a heat transfer coefficient of the cooling gas is primarily a function of pressure between the first and second pressures.

19. A gas-cooled clamp for selectively cooling a substrate thereon, comprising:

a guard ring having an inside diameter that is greater than a diameter of the substrate;

a clamping plate having a top surface for support of the substrate thereon, the clamping plate further comprising:

a center portion supporting the substrate;

a peripheral portion supporting the guard ring;

an intermediate portion disposed between the center portion and the peripheral portion, the intermediate portion supporting a peripheral edge portion of the substrate and an inside diameter portion of the guard ring; and a plurality of protrusions associated with at least the top surface of the center portion of the clamping plate, the plurality of protrusions defining a plurality of gaps therebetween and a gap distance when the substrate resides thereon, wherein a cooling gas resides therein;

an isothermal gasket overlying the intermediate portion of the clamping plate, and operable to facilitate uniform heat transfer between the guard ring and the substrate; and a pressure control system operable to control a backside pressure of the cooling gas within the plurality of gaps between a first pressure and a second pressure, wherein a heat transfer coefficient of the cooling gas is primarily a function of pressure between the first and second pressures.

20. A gas-cooled clamp for selectively cooling a substrate thereon, comprising:

a guard ring having an inside diameter that is greater than a diameter of the substrate;

a clamping plate having a top surface for support of the substrate thereon, the clamping plate further comprising:

a center portion supporting the substrate;

a peripheral portion supporting the guard ring;

an intermediate portion disposed between the center portion and the peripheral portion, the intermediate portion supporting a peripheral edge portion of the substrate and an inside diameter portion of the guard ring; and a plurality of protrusions associated with at least the top surface of the center portion of the clamping plate, the plurality of protrusions defining a plurality of gaps therebetween and a gap distance when the substrate resides thereon, wherein a cooling gas resides therein;

a support plate underlying and thermally coupled to the clamping plate;

a base plate underlying the support plate, wherein the base plate further comprises one or more first fluid conduits operable to generally permit a cooling fluid to flow between the base plate and the support plate;

a diffusion plate underlying and spaced from the base plate, wherein the diffusion plate further comprises one or more second fluid conduits operable to generally direct allow of the cooling fluid toward the base plate; and a pressure control system operable to control a backside pressure of the cooling gas within the plurality of gaps between a first pressure and a second pressure, wherein a heat transfer coefficient of the cooling gas is primarily a function of pressure between the first and second pressures.

21. A gas-cooled clamp for selectively cooling a substrate thereon, comprising:

a guard ring having an inside diameter that is greater than a diameter of the substrate;

a clamping plate having a top surface for support of the substrate thereon, the clamping plate further comprising:

a center portion supporting the substrate;

a peripheral portion supporting the guard ring;

an intermediate portion disposed between the center portion and the peripheral portion, the intermediate portion supporting a peripheral edge portion of the substrate and an inside diameter portion of the guard ring; and a plurality of protrusions associated with at least the top surface of the center portion of the clamping plate, the plurality of protrusions defining a plurality of gaps therebetween and a gap distance when the substrate resides thereon, wherein a cooling gas resides therein;

a support plate underlying and thermally coupled to the clamping plate;

one or more o-rings associated with a bottom surface thereof facing the support plate, wherein the o-rings are operable to permit a vertical translation of the clamping plate; and a pressure control system operable to control a backside pressure of the cooling gas within the plurality of gaps between a first pressure and a second pressure, wherein a heat transfer coefficient of the cooling gas is primarily a function of pressure between the first and second pressures.

22. A gas-cooled clamp for selectively cooling a substrate thereon, comprising:

a guard ring having an inside diameter that is greater than a diameter of the substrate;

a clamping plate having a top surface for support of the substrate thereon, the clamping plate further comprising:

a center portion supporting the substrate;

a peripheral portion supporting the guard ring;

an intermediate portion disposed between the center portion and the peripheral portion, the intermediate portion supporting a peripheral edge portion of the substrate and an inside diameter portion of the guard ring, wherein the center portion, peripheral portion, and intermediate portion are separate portions of the clamping plate, wherein the center portion, peripheral portion, and intermediate portion are operable to independently vertically translate; and a plurality of protrusions associated with at least the top surface of the center portion of the clamping plate, the plurality of protrusions defining a plurality of gaps therebetween and a gap distance when the substrate resides thereon, wherein a cooling gas resides therein; and a pressure control system operable to control a backside pressure of the cooling gas within the plurality of gaps between a first pressure and a second pressure, wherein a heat transfer coefficient of the cooling gas is primarily a function of pressure between the first and second pressures.

* * * * *